United States Patent
Melzner

(10) Patent No.: US 9,299,656 B2
(45) Date of Patent: Mar. 29, 2016

(54) VIAS AND METHODS OF FORMATION THEREOF

(71) Applicant: Infineon Technologies AG, Neubiberg (DE)

(72) Inventor: Hanno Melzner, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/293,793

(22) Filed: Jun. 2, 2014

(65) Prior Publication Data
US 2015/0348903 A1 Dec. 3, 2015

(51) Int. Cl.
- H01L 23/48 (2006.01)
- H01L 23/522 (2006.01)
- H01L 23/528 (2006.01)
- H01L 21/768 (2006.01)

(52) U.S. Cl.
CPC ...... *H01L 23/5226* (2013.01); *H01L 21/76805* (2013.01); *H01L 21/76846* (2013.01); *H01L 21/76877* (2013.01); *H01L 21/76897* (2013.01); *H01L 23/528* (2013.01)

(58) Field of Classification Search
CPC .............. H01L 23/5226; H01L 21/76877
USPC .......................................... 257/774; 438/629
See application file for complete search history.

(56) References Cited

U.S. PATENT DOCUMENTS

| | | | |
|---|---|---|---|
| 5,470,790 A | 11/1995 | Myers et al. | |
| 5,905,307 A | 5/1999 | Onoda | |
| 6,096,637 A | 8/2000 | Sriram et al. | |
| 6,316,836 B1 | 11/2001 | Mayuzumi | |
| 6,358,832 B1 * | 3/2002 | Edelstein et al. | 438/612 |
| 6,573,606 B2 | 6/2003 | Sambucetti et al. | |
| 6,806,579 B2 * | 10/2004 | Cowley et al. | 257/762 |
| 7,348,648 B2 | 3/2008 | Yang et al. | |
| 7,585,764 B2 | 9/2009 | Chanda et al. | |
| 7,605,072 B2 | 10/2009 | Yang et al. | |
| 7,732,924 B2 | 6/2010 | Chanda et al. | |
| 2003/0148618 A1 * | 8/2003 | Parikh | 438/694 |

FOREIGN PATENT DOCUMENTS

JP 2007251155 A 9/2007

OTHER PUBLICATIONS

Li, B., et al., "Minimum Void Size and 3-Parameter Longnormal Distibution for EM Failures in Cu Interconnects," Reliability Physics Symposium Proceedings, 44th Annual, Mar. 26-30, 2006, pp. 115-122.

Li, B., "Line Depletion Electromigration Characteristicsw of Cu Interconnects," Reliability Physics Symposium Proceedings, 41st Annual, Mar. 30-Apr. 4, 2003, pp. 140-145.

(Continued)

*Primary Examiner* — Theresa T Doan
(74) *Attorney, Agent, or Firm* — Slater & Matsil, L.L.P.

(57) ABSTRACT

In accordance with an embodiment of the present invention, a semiconductor device includes a first metal line disposed in a first insulating layer, and a via having a portion surrounding a portion of a first sidewall of the first metal line.

14 Claims, 15 Drawing Sheets

(56) References Cited

OTHER PUBLICATIONS

Pompl, T., et al., "Practical Aspects of Reliability Analysis for IC Designs," Design Automation Conference, 2006 43rd ACM/IEEE, pp. 193-198.

Ueki, M., et al., "Suppression of Stress Induced Open Failures between Via and Cu Wide Line by inserting Ti Layer Ta/TaN Barrier," Electron Devices Meeting, Dec. 8-11, 2002, pp. 749-752.

Ueno, K., et al., "A High Reliability Copper Dual-Damascene Interconnection With Direct-Contact Via Structure," Electron Devices Meeting, 2000 IEDM '00 Technical Digest International, Dec. 10-13, 2000, pp. 265-268.

Yang, C.-C., et al., "Enhanced Via Integration Process for Copper/Ultralow-k Interconnects," IEEE Electron Device Letters, vol. 31, No. 4, Apr. 2010, pp. 347-349.

* cited by examiner

US 9,299,656 B2

VIAS AND METHODS OF FORMATION THEREOF

TECHNICAL FIELD

The present invention relates generally to semiconductor devices, and, in particular embodiments, to vias and methods of formation thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases, the front end of line (FEOL) and the back end of line (BEOL). The BEOL is typically considered to be the phase of the manufacturing process where metallization layers are formed, and the FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). The conductive lines in adjacent horizontal metallization layers are connected vertically in predetermined places by vias formed between the conductive lines.

One of the challenges in semiconductor technology requires developing technologies that minimize process cost while maximizing performance and reliability. Reliability critical applications include aeronautics, space/satellites, automotive, medical, industrial applications. This is because failure of the product during use in one of these applications has severe consequences. For example, in case of failure, danger of injury and death (aeronautics, automotive), risk of expensive consequences (industrial: line stop, major damage to material, equipment etc.), and/or impossibility, impracticability or very high cost of repair (medical implants, space). Hence, a given technology is optimized in view of the process limitations. A challenge in forming vias relates to the avoidance of defects, which impact reliability. Thus, what are needed in the art are cost effective ways of forming BEOL metallization without significant increase in costs or yield, performance and reliability loss.

SUMMARY OF THE INVENTION

In accordance with an embodiment of the present invention, a semiconductor device comprises a first metal line disposed in a first insulating layer, and a via having a portion surrounding a portion of a first sidewall of the first metal line.

In accordance with an alternative embodiment of the present invention, a semiconductor device comprises a plurality of lower metal lines disposed in a first insulating layer. A plurality of upper metal lines is disposed in a second insulating layer. The second insulating layer is disposed over the first insulating layer. A plurality of vias is disposed between the plurality of lower metal lines and the plurality of upper metal lines. A via of the plurality of vias surrounds a portion of a first sidewall of a first metal line of the plurality of lower metal lines.

In accordance with an alternative embodiment of the present invention, a method of forming a semiconductor device comprises forming a first metal line disposed in a first insulating layer, and forming a via having a portion surrounding a portion of a first sidewall of the first metal line.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1E illustrate a semiconductor device comprising a wrap-around via in accordance with an embodiment of the present invention, wherein FIG. 1A illustrates a cross-sectional view of the semiconductor device illustrating multiple layers of metal and via levels disposed over a substrate, wherein FIG. 1B illustrates a sectional view of a plane along the plane 1B-1B illustrated in FIG. 1A, wherein FIGS. 1C and 1D illustrate magnified cross-sectional views of a semiconductor device of a plane along the planes 1C-1C and 1D-1D illustrated in FIG. 1B, wherein FIG. 1E illustrates the magnified cross-sectional view of FIG. 1C with additional misalignment between the via and the underlying metal line;

DETAILED DESCRIPTION OF ILLUSTRATIVE EMBODIMENTS

The present invention will be described with respect to preferred embodiments in a specific context, namely a structure and method for forming interconnect metallization using damascene processes.

In conventional processes and designs, vias are susceptible to failure due to many reasons. Vias are known to be susceptible to reliability failures and often may be the largest single source of failure in metallization. Defects in the via may be due to polymer residues, or interfacial layers. Defects may also arise due to incomplete metal filling of the via hole. Further, voids may be formed during operation due to processes such as electro-migration. Additionally, mechanical stress related migration may also cause material migration and eventually voids under, in, or above the via. These effects may be further accelerated at elevated temperatures as well as due to current crowding, i.e., due to high current densities and local heating inside the via.

Approaches such as the use of redundant vias improve reliability but at the cost of area penalty. In various embodiments, the invention improves the reliability of vias without a significant area penalty. Embodiments of the present invention employ the robustness of the contact between the conductive liner of the vias and the conductive liner of the underlying metal line. In various embodiments, the present invention overcomes these limitations by forming a wrap-around via, which is wider than the underlying metal line in at least one dimension. Consequently, in various embodiments, the via at least partially wraps around sidewalls of the underlying metal line.

A structural embodiment of the present invention will be described using FIG. 1. Alternative structural embodiments will be described using FIGS. 2-4. A method of fabricating the semiconductor device will be described using FIG. 5. An alternative method of fabricating the semiconductor device will be described using FIG. 6.

Figure 1A:
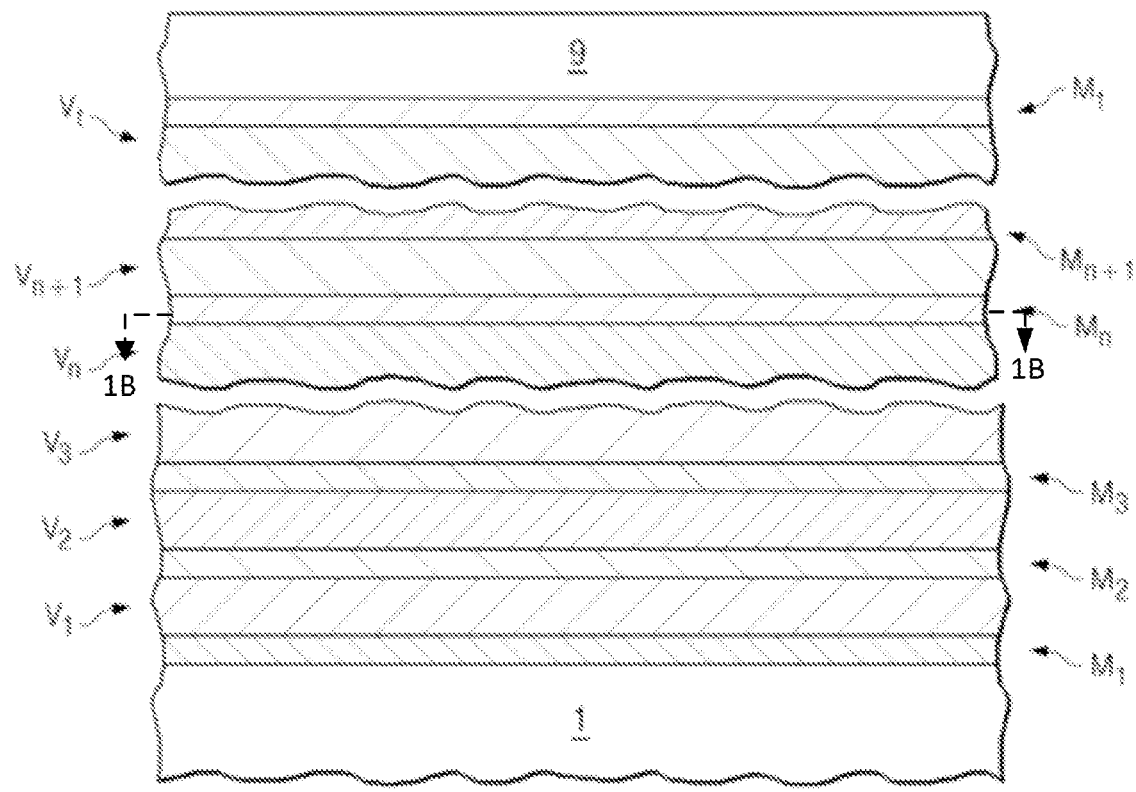
Figure 1B:
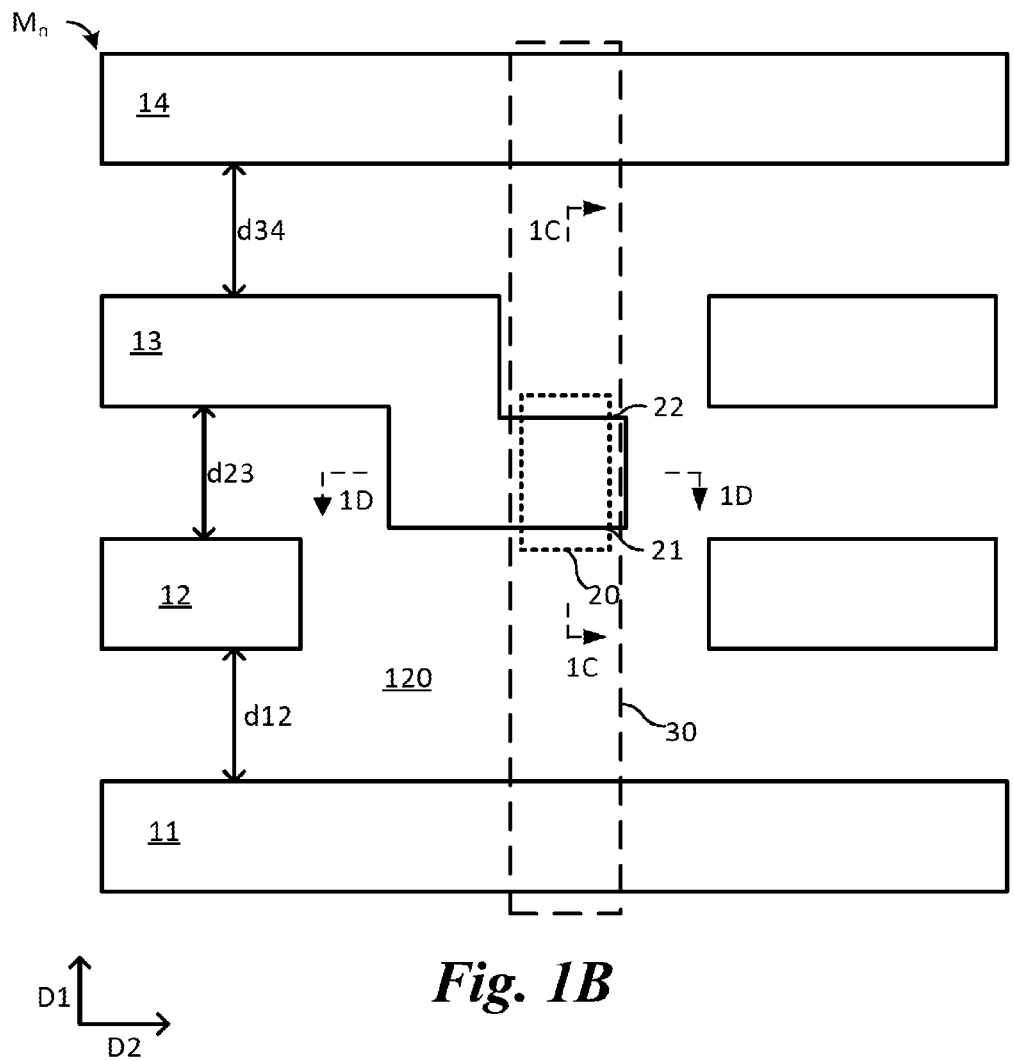
Figure 1C:
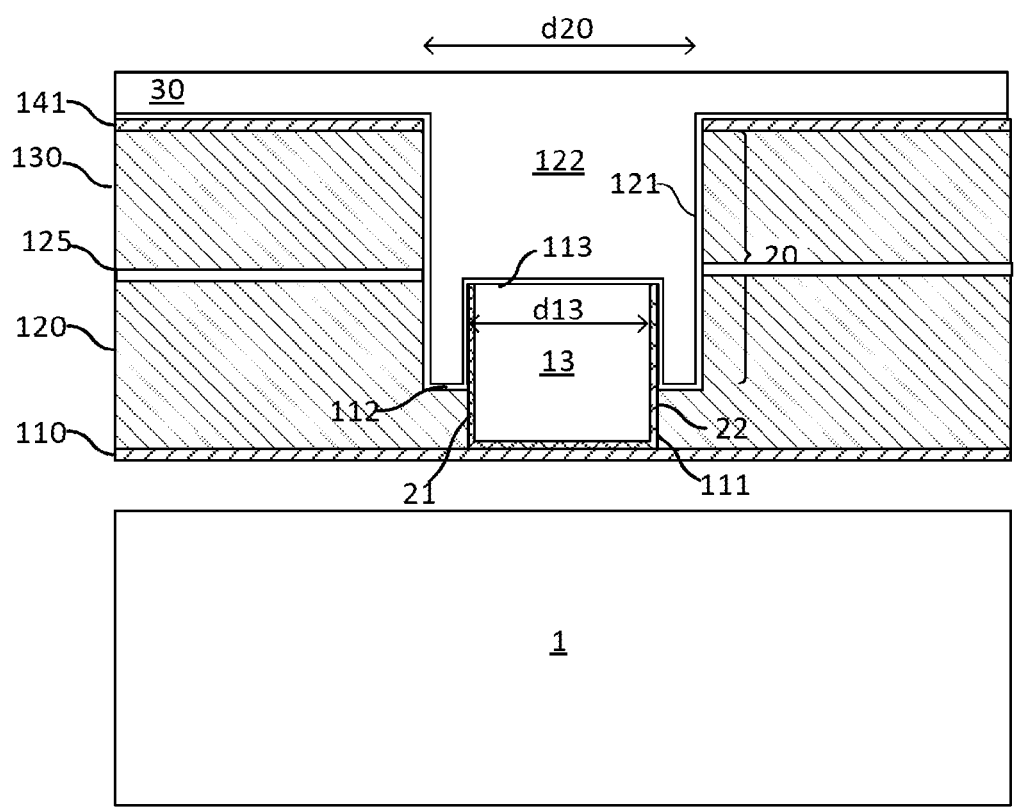
Figure 1D:
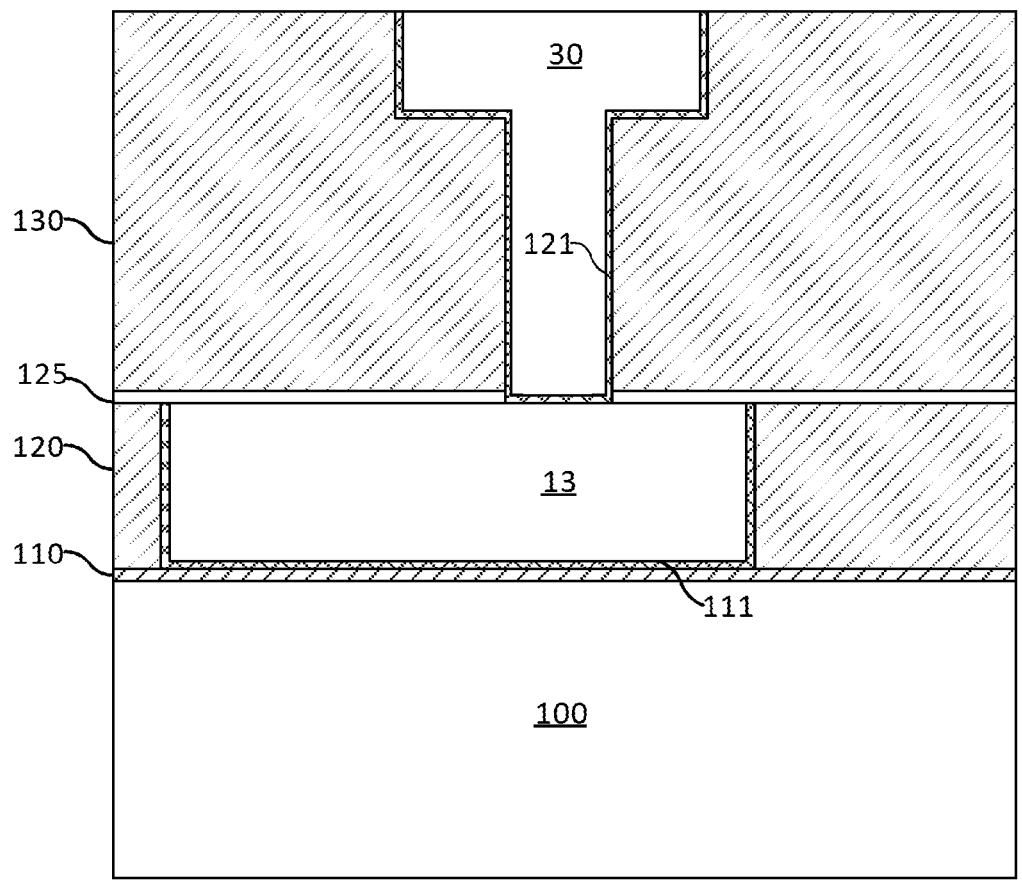
Figure 1E:
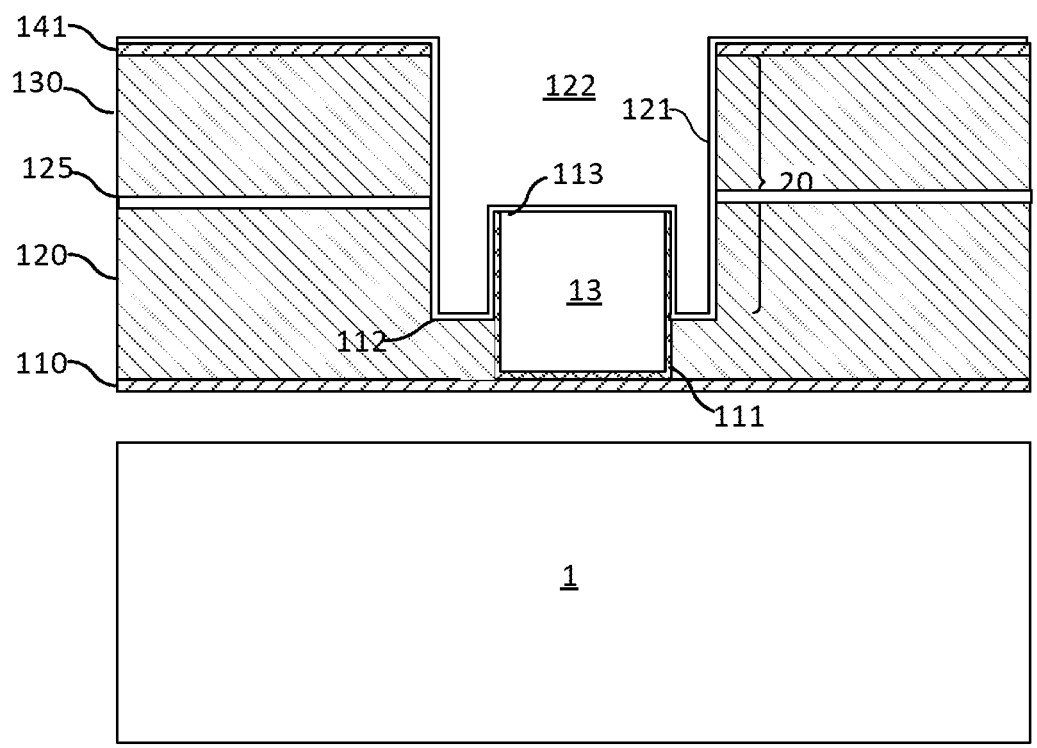

FIGS. 1A-1E illustrate a semiconductor device comprising a wrap-around via in accordance with an embodiment of the present invention. FIG. 1A illustrates a cross-sectional view of the semiconductor device illustrating multiple layers of metal and via levels disposed over a substrate. FIG. 1B illustrates a sectional view of a plane along the plane 1B-1B illustrated in FIG. 1A. FIGS. 1C and 1D illustrate magnified cross-sectional views of a semiconductor device of a plane along the planes 1C-1C and 1D-1D illustrated in FIG. 1B. FIG. 1E illustrates the magnified cross-sectional view of FIG. 1C with additional misalignment between the via and the underlying metal line.

The substrate 1 comprises the active devices forming the active circuitry of the semiconductor device. The active circuitry contains the active device regions and may include necessary transistors, resistors, capacitors, inductors or other components used to form integrated circuits. For example, active areas that include transistors (e.g., CMOS transistors) may be separated from one another by isolation regions (e.g., shallow trench isolation).

Next, metallization is formed over the active device regions to electrically contact and interconnect the active devices. The metallization and active device regions together form a complete functional integrated circuit. In other words, the electrical functions of the chip can be performed by the interconnected active circuitry.

FIG. 1A illustrates the metallization formed with metal levels $M_1$ to $M_t$ and corresponding via levels $V_1$ to $V_t$. The metal levels connect the various active devices on the chip, whereas, the via levels connect the different metal levels. In logic devices, the metallization may include many layers, e.g., nine or more, of copper or alternatively of other metals. In other devices such as memory devices, the number of metal levels may be less and may be aluminum. The interconnect structure is typically covered with additional passivation layer 9 and suitable structure forming connections for packaging.

A sectional view from top of a metal level $M_n$ is illustrated in FIG. 1B. Each metal level comprises metal lines embedded in an inter-level dielectric layer. For example, the metal level $M_n$ comprises a first metal line 11, a second metal line 12, and a third metal line 13, and a fourth metal line 14 embedded in a first inter level dielectric layer 120. An upper level metal line 30 is disposed in a second inter level dielectric layer 130 in a lower metal level $M_n$.

As illustrated in FIGS. 1C and 1D, the upper level metal line 30 is coupled to the third metal line 13 through a via 20. The third metal line 13 has a critical dimension d13 as illustrated in FIG. 1C. The critical dimension of all metal lines on the same metal level ($M_n$) may be the same. The via 20 has a critical dimension d20 along a first direction D1 (FIG. 1B). The critical dimension d20 of the via 20 is greater than the critical dimension d13 of the third metal line 13.

The first inter level dielectric layer 120 is separated from underlying metal or via levels by a first etch stop layer 110. The first inter level dielectric layer 120 may be separated from the second inter level dielectric layer 130 by a second etch stop layer 125. Additionally, the third etch stop layer 141 may be disposed over the second inter level dielectric layer 130. In one or more embodiments, the first etch stop layer 110 may be optional. Thus, in various embodiments, the via 20 extends through the second inter level dielectric layer 130 and into the first inter level dielectric layer 120.

As illustrated in FIGS. 1C and 1D, the third metal line 13 includes a first conductive liner 111 at the sidewalls and the bottom surface of the third metal line 13. The conductive liner 111 may include multiple layers such as a adhesion layer, a diffusion barrier layer, and a seed layer for a fill material such as copper.

Similarly, the via 20 and the upper level metal line 30 include a second conductive liner 121 and a fill metal 122. The fill metal 122 of the via 20 is separated from the third metal line 13 by the second conductive liner 121.

Further, as illustrated in FIG. 1C, the via 20 wraps around the third metal line 13 at least partially. In various embodiments, a via 20 wraps around a metal line if it overlaps with at least a portion of one sidewall of the metal line. The via 20 may not overlap the metal line along its complete depth. This is because the via 20 has a depth greater than a conventional via, which extends only up to a top surface of the underlying metal line. In contrast, as illustrated in FIG. 1C, the via 20 has a lower surface 112 beneath the top surface 113 of the third metal line 13. To clarify, as illustrated in FIG. 1B, the via 20 does not overlap with the complete sidewall of the third metal line 13 along the direction D2. Rather, the via 20 overlaps a portion of the sidewalls 21 and 22.

As further illustrated in FIG. 1D, in a different cross-sectional view along the line 1D-1D in FIG. 1B along the second direction D2, the via 20 is coupled between the upper level metal line 30 and the third metal line 13 as in a conventional via.

Referring to FIG. 1C, the second conductive liner 121 contacts the first conductive liner 111 at multiple places along the sidewalls of the third metal line 13. During operation, even if all the copper in the third metal line 13 or the via 20 migrates out, an electrical and physical contact between the first conductive liner 111 and the second conductive liner 121 is present. Thus, the via resistance will increase due to the absence of copper but reach a stable value defined by the barrier contact resistance between the first conductive liner 111 and the second conductive liner 121. This resistance increase may be acceptable for circuit operation in many applications preventing a critical failure. For instance, a typical CMOS transistor in a logic circuit has an "on" resistance in the order of $K\Omega$. If a via is in series with such a transistor, the via resistance has to be smaller that this transistor resistance. Therefore, via resistance up to, e.g., $50\Omega$ (about 5%) may be tolerated in this configuration. Similarly, if a via is used to connect a logic transistor gate, only very small capacitances (in the order of Femto Farads) have to charged. Consequently, only very small currents are needed, and voltage drop even across a relatively high series resistance is small. A barrier contact as described in various embodiments may thus be sufficient to ensure circuit functionality for many or all vias in a circuit.

In various embodiments, in order to achieve such a reliable and reproducible barrier contact, the via 20 is formed such that it overlaps at least one side of the lower metal line. In further embodiments, the via 20 overlaps both sides of the lower metal line.

In various embodiments, the via opening for the via is formed so that the bottom of the via opening is below the upper surface of the lower metal line. Thus, the conductive barrier liners used during the formation of the via wrap around sidewalls of the lower metal line. In this manner, an extended vertical contact between the conductive barrier liners of the lower metal line and the upper metal line is formed at the sidewalls of the lower metal line. Because of the overlap of the conductive liners, the barrier resistance is immune to misalignment. An example of such misalignment is shown in FIG. 1E.

In embodiments using aluminum metallization, conductive liners may not be used. However, even in such embodiments, the use of the wrap-around via improves the contact due to the increased contact area between the via and the lower metal line and may be advantageous, for example, improve mechanical stability and reduce risk of delamination, and others.

Referring to FIG. 1B, the distance between the first metal line 11 to the second metal line 12 is a first distance d12, the distance between the second metal line 12 and the third metal line 13 is a second distance d23, while the distance between the third metal line 13 and the fourth metal line 14 is a third distance d34. Technology specifications usually require a constant minimum pitch. Accordingly, the first distance d12, the second distance d23 and the third distance d34 are equal in the layout and are substantially equal in the actual device. The space between via and lower metal is not defined by one mask but alignment between the metal and via mask. If edge placement error (dimensional error and misalignment) is sufficiently small, this distance may be smaller than the lithographical limit for shapes on the same mask. Therefore, technology specifications also require a minimum distance between via and underlying metal lines. For example, the lateral distance between the via 20 and the adjacent metal line (first metal line 11 or fourth metal line 14) has to be greater than a minimum distance. In other words, because of this limitation, the second metal line 12 may not extend next to the via 20. This increases the area required to form a via and therefore may not be used in some embodiments.

Figure 2A:
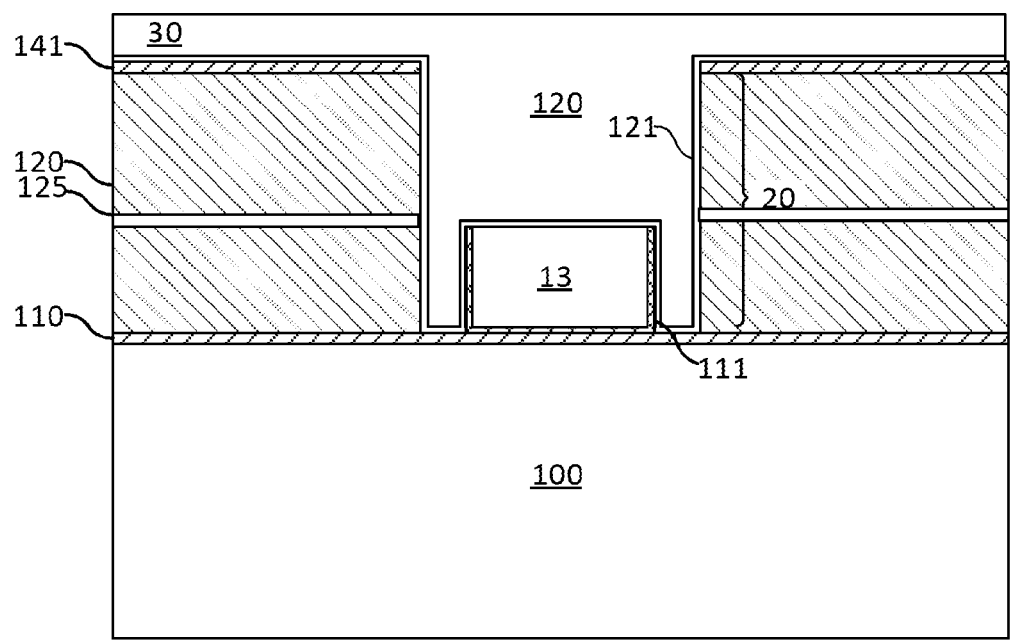
FIGS. 2A and 2B illustrate an alternate embodiment of a wrap-around via formed between two metal lines.
Figure 2B:
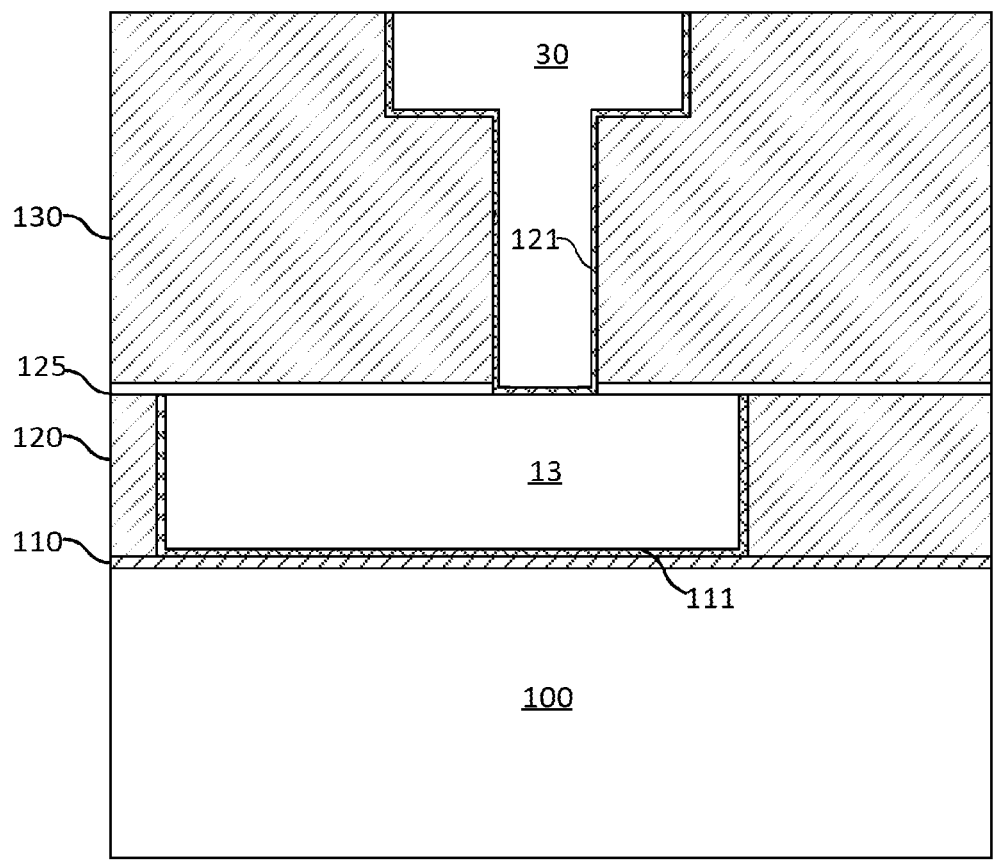

FIGS. 2A and 2B illustrate an alternate embodiment of a wraparound via formed between two metal lines. FIG. 2A illustrates a cross-sectional view along the plane 1C-1C of FIG. 1B while FIG. 2B illustrates a cross-sectional view along the plane 1B-1B of FIG. 1B.

Unlike the prior embodiment, in this embodiment, the via 20 wraps around the third metal line 13 so as to cover the complete sidewall of the third metal line 13. In this embodiment, the via 20 overlaps a portion of the sidewall of the metal line along its complete depth. As illustrated in FIG. 2A, via 20 extends down to the first etch stop layer 110. Thus, the first conductive liner 111 is covered by the second conductive liner 121.

Figure 3:
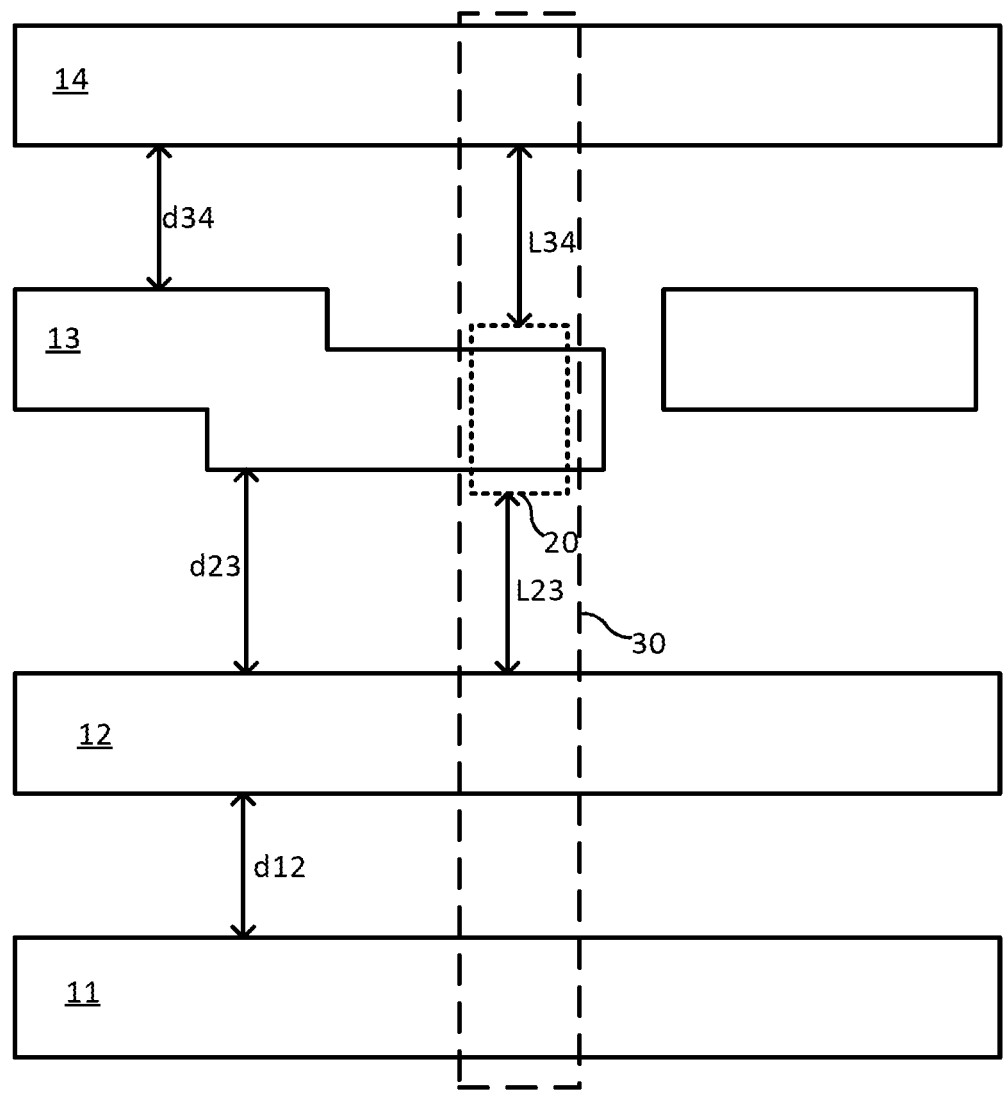
FIG. 3 illustrates a top sectional view of the semiconductor device having metal lines underlying the wrap around via in accordance with an alternative embodiment of the present invention.

FIG. 3 illustrates a top sectional view of the semiconductor device having metal lines underlying the wrap around via in accordance with an alternative embodiment of the present invention.

Embodiments of the present invention save considerable area particularly in routing of logic cells, compared to other structures with similar reliability (such as double vias). In some embodiments, the wrap around vias may be placed such that only half a track of metal is lost in either the upper or lower layer (in contrast to a double via arrangement where one track is lost). This is because a double via requires an extra track of upper metal or lower metal so that the via-to-via spacing is maintained to be the standard metal-to-metal spacing.

In this embodiment, instead of an additional metal line, the adjacent metal line is moved further away from the metal line contacting the via. For example, the second distance d23 is greater than the third distance d34 such that the lateral distance L23 between the second metal line 12 and the via 20 is about equal to the lateral distance L34 between the via 20 and the fourth metal line 14. Consequently, this embodiment takes up less area than the embodiment described with respect to FIG. 1.

Figure 4A:
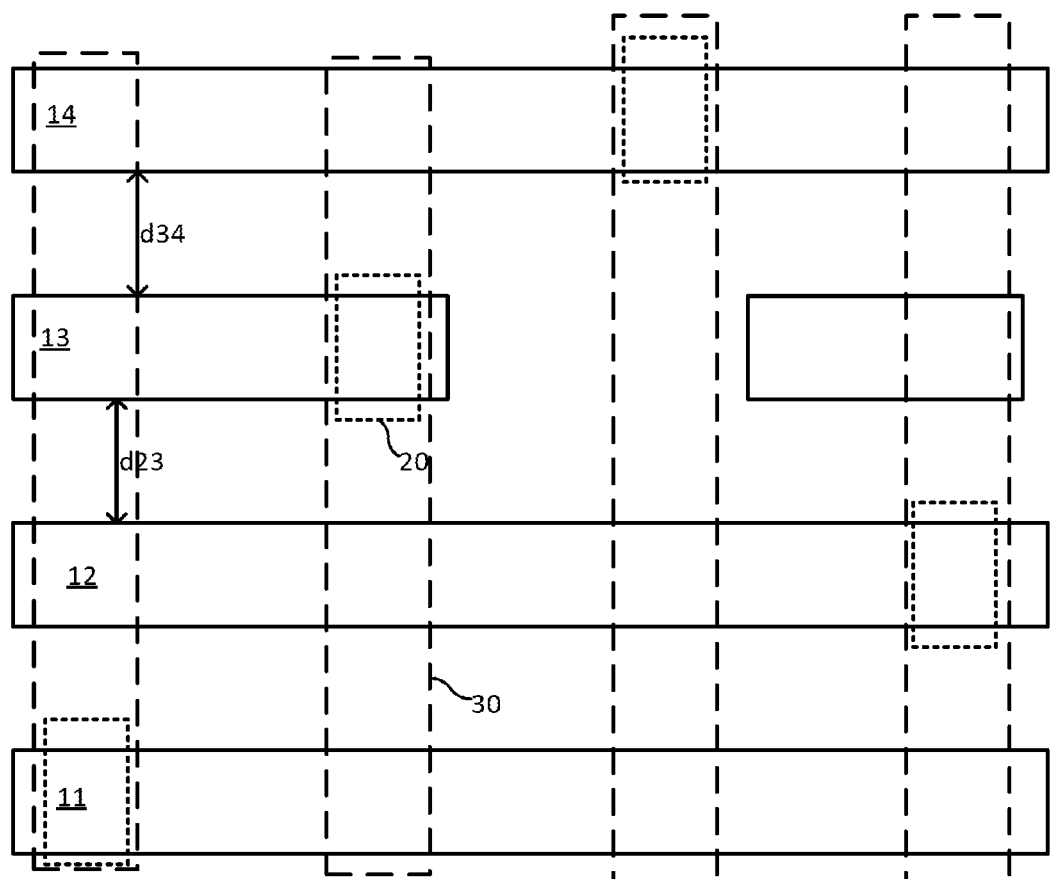
FIGS. 4A and 4B illustrates top sectional views of the semiconductor device having metal lines underlying the wrap around via in accordance with an alternate embodiment of the present invention.
Figure 4B:
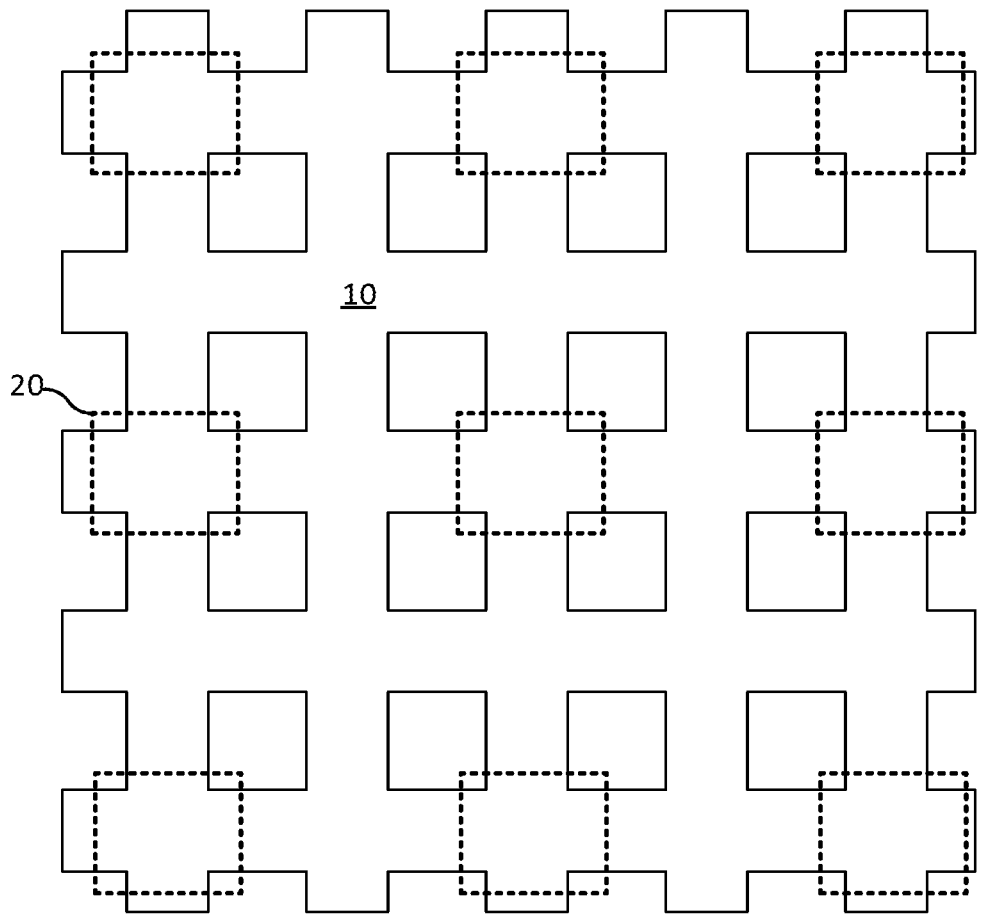

FIGS. 4A and 4B illustrates top sectional views of the semiconductor device having metal lines underlying the wrap around via in accordance with an alternate embodiment of the present invention.

Referring to FIG. 4A, in another embodiment, no additional space may be required to form the wrap around via 20. Accordingly, in this embodiment, the metal lines in the underlying metal level may be formed at a minimum pitch metal line on a grid. This enables the placement of the vias as an array on the metal line and is therefore the most efficient in terms of using silicon area.

The embodiment illustrated in FIG. 4A may be used depending on the achievable edge placement error (as a function of printed size accuracy and misalignment) resulting in no loss of metal track. Thus, this embodiment illustrates a cross-point via that does not require any deviation from the regular minimum size metal grid and thus requires no extra space. Furthermore, realization of a cross-point via is the pre-requisite to metallization schemes where only perfectly regular metal grids are printable. However, using embodiments of the present invention, implementing such metallization schemes does not require a compromise in reliability because of the robust barrier contact that survives even if copper voids are formed below, inside or above the via.

FIG. 4B illustrates a top sectional view of wrap around via arrays in accordance with an embodiment of the present invention.

For connections that carry high currents a single via hole may not be sufficient even if realized as a single wrap-around via hole. Instead, in one or more embodiments, arrays of wrap-around vias 20 may be formed. For instance by forming a mesh-like pattern in the lower metal 10, and placing vias on the nodes of the mesh such that multiple robust liner-to-liner connections are formed, for example, as described in various embodiments. As current is distributed through many vias 20 and many liner-to-liner connections. Thus, using this embodiment, larger currents than with a single wrap-around via may be carried between the lower and upper metal lines. This embodiment may be also used in analog circuits, where vias between high current power lines is needed.

FIGS. 5A-5H illustrate cross-sectional views illustrating a semiconductor device during various stages of fabrication in accordance with embodiments of the present invention.

Figure 5A:
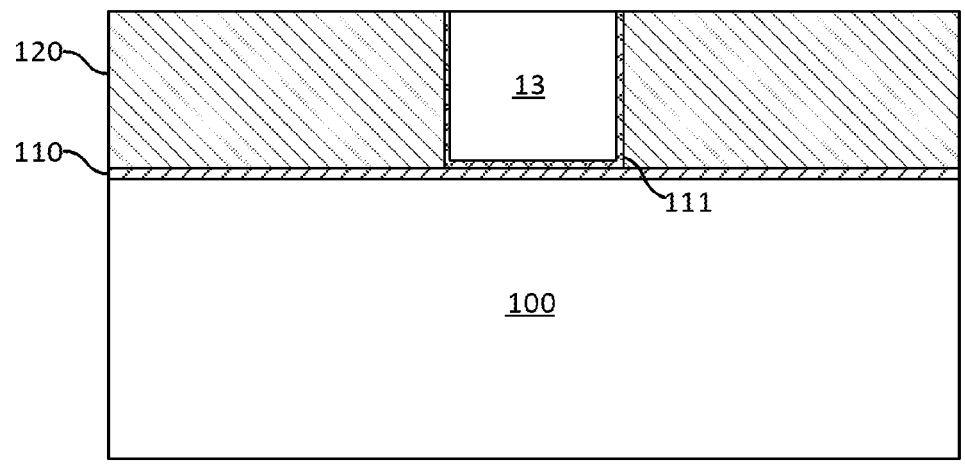
FIGS. 5A-5H are cross-sectional views illustrating a semiconductor device during various stages of fabrication in accordance with embodiments of the present invention.

FIG. 5A illustrates a metal line formed within an insulating layer over a workpiece 100. The workpiece 100 may include a semiconductor substrate with many metal levels and via levels formed over the substrate.

As illustrated in FIG. 5A, a first etch stop liner 110 is formed over the workpiece followed by a first inter level dielectric layer 120. The first inter level dielectric layer 120 may be a low-k dielectric material such as a material selected from the group comprising silicon dioxide ($SiO_2$), fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) and methylsilsesquioxane (MSQ). In some embodiments, the first inter level dielectric layer 120 comprises ultra low-k materials such as porous silicate glass, xerogel, aerogel, nano clustered silica (NCS), porous organo silicate glass, porous organics. The first inter level dielectric layer 120 may either be spin-on material or deposited by techniques such as CVD.

As an example, a third metal line 13 is formed in the first inter level dielectric layer 120. The third metal line 13 may be formed using a damascene or a dual damascene process in one or more embodiments, and may comprise copper.

Figure 5B:
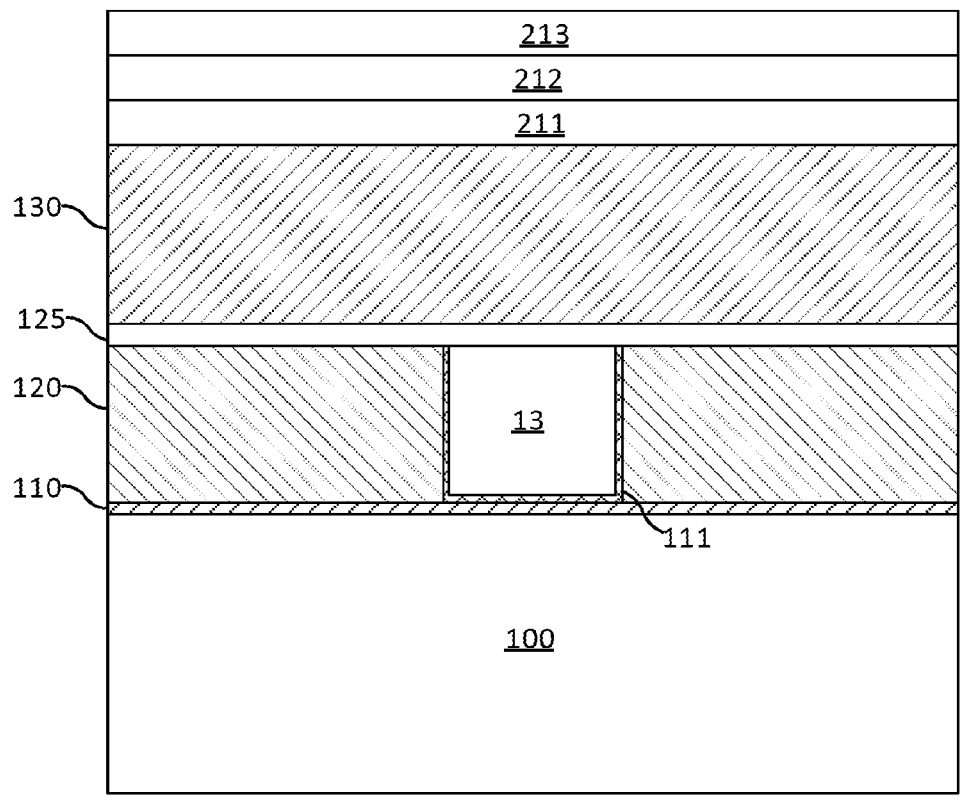

Referring to FIG. 5B, a second etch stop layer 125 is deposited over the first inter level dielectric layer 120. In some embodiments, the second etch stop layer 125 may be skipped. A second inter level dielectric layer 130 is deposited over the second etch stop layer 125.

A first hard mask layer 211 is deposited over the second inter level dielectric layer 130. The first hard mask layer 211 comprises $SiO_2$ such as tetra ethyl oxysilane (TEOS), silicon carbide (SiC) or carbon doped glass, but in various embodiments other materials may be used.

A first antireflective coating (ARC) layer 212 is deposited over the first hard mask layer 211. A first photo resist 213 is deposited over the first ARC layer 212. A via mask is used to expose the first photo resist 213. The first photo resist 213 is next developed, for example, by a low temperature bake. The exposed first photo resist 213 is etched to expose the first ARC layer 212. An anisotropic RIE process etches the first ARC layer 212, the first hard mask layer 211, and the second inter level dielectric layer 130.

Figure 5C:
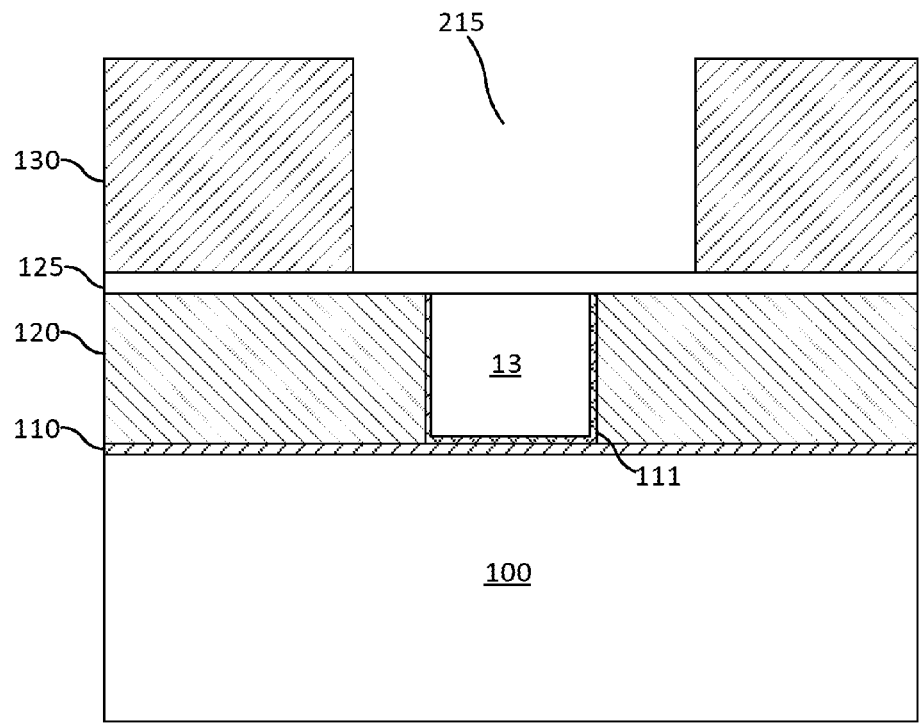
Figure 5D:
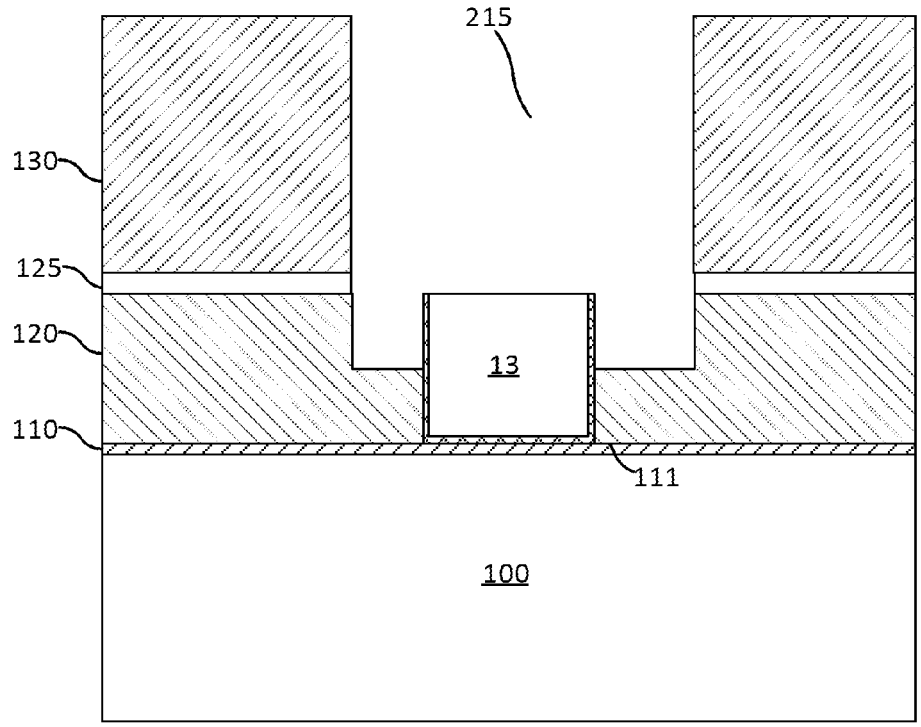

Referring to FIG. 5C, a via opening 215 is formed. The via etch may be stopped at the second etch stop layer 125 (if present). In some embodiments, the second etch stop layer 125 is etched in a $CF_4/CO$ or $Ar/CO_2/CF_4/CH_2F_2$ etch chemistry. Subsequently, after etching the exposed second etch stop layer 125, a timed etched may be performed to etch below the top surface of the third metal line 13 as illustrated in FIG. 5D. The timed etch has to controlled to account for process variations and misalignments. Some or all of the first photo resist 213 may be etched during the formation of the via openings 215. Alternatively, in the absence of the second etch stop layer 125, a single timed etch may be used. However, such a timed etch may be susceptible to more variation.

In one or more embodiments, an additional dielectric etch may be performed to remove any first inter level dielectric layer 120 remaining on sidewalls of the third metal line 13. The additional dielectric etch may be an isotropic etch and may be designed to remove the stringer or spacer remaining after the anisotropic etch.

Figure 5E:
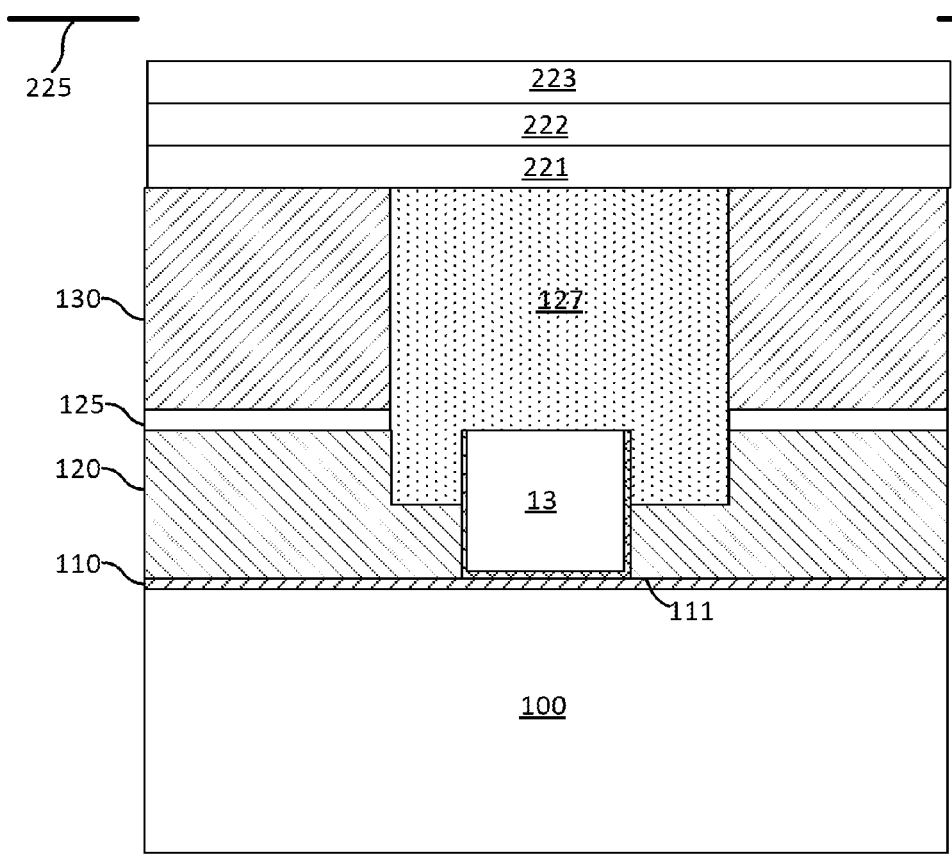

As next illustrated in FIG. 5E, a dummy fill material 127 is next used to fill the via openings 215 and forms the dummy filled via openings. In one or more embodiments, the dummy fill material 127 comprises a planarizing spin on material and/or other bottom anti-reflective coating materials (BARC). The dummy fill material 127 is overfilled to form a smooth surface.

Referring next to FIG. 5E, a second hard mask layer 221 is deposited over the dummy fill material 127, followed by a deposition of a second anti reflective coating (ARC) layer 222. The second hard mask layer 221 comprises a low temperature oxide layer. A second photo resist 223 is deposited over the second ARC layer 222. A metal line mask 225 is used to pattern the second photo resist 223.

Figure 5F:
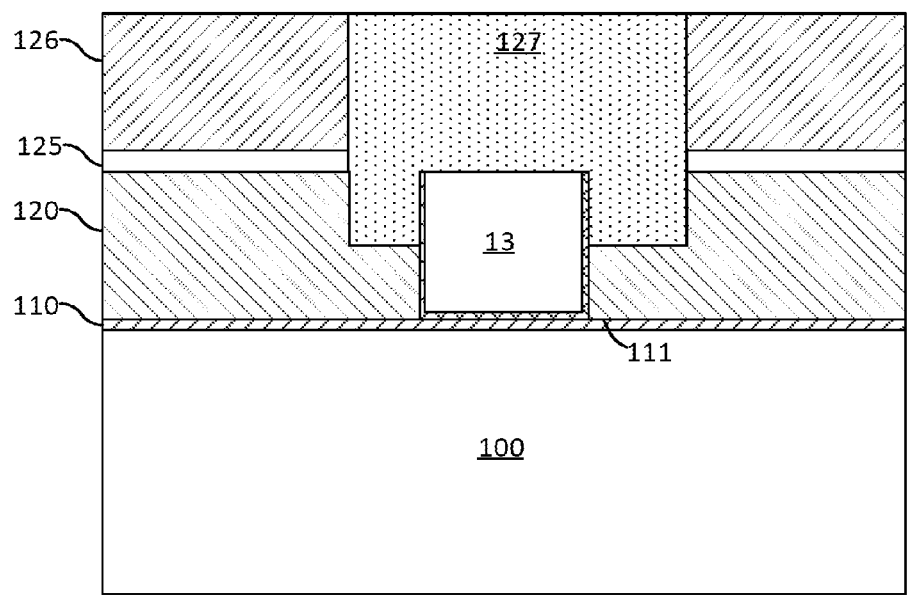

FIG. 5F illustrates the device after an anisotropic etch process using the metal line mask. An anisotropic etch is used to etch through the second ARC layer 222, the second hard mask layer 221. The anisotropic etch comprises a reactive ion etch (RIE) in various embodiments. In various embodiments, the second ARC layer 222 and the second hard mask layer 221 are etched using a $CF_4/CHF_3$ chemistry.

Figure 5G:
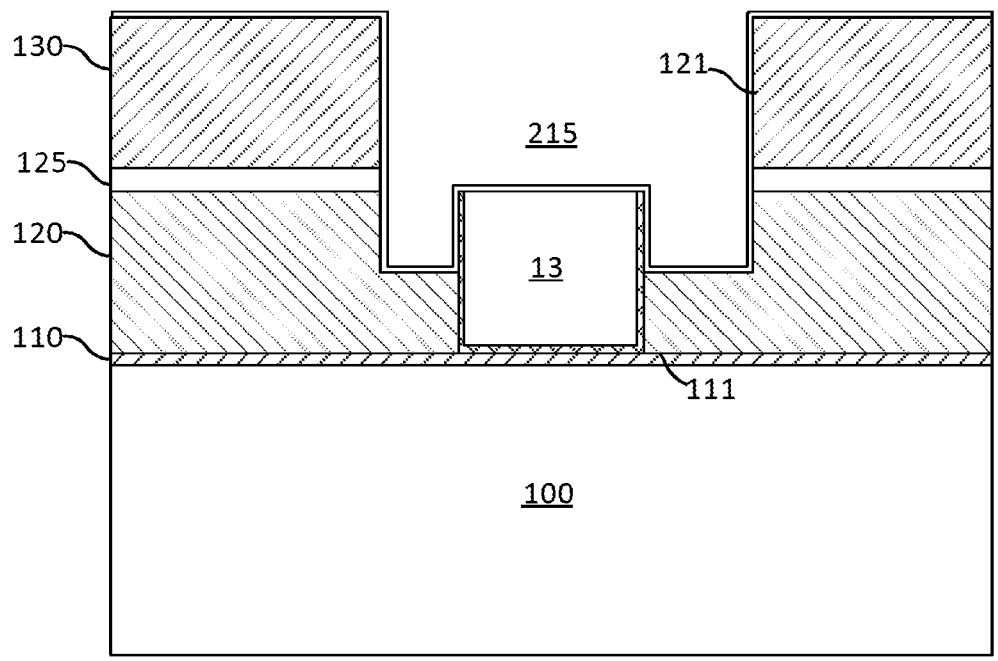

Subsequently, as illustrated in FIG. 5G, the etch proceeds by removing the dummy fill material 127 from the dummy filled via openings 215. The RIE progresses using a $CO/N_2$, $Ar/O_2$ or $O_2/CO/N_2$ chemistry to etch the dummy fill material 127 and the second inter level dielectric layer 130. In one or more embodiments, the RIE chemistry may be selected differently to etch the dummy fill material 127 and the second inter level dielectric layer 130. Other suitable etch chemistries may be used to etch the dummy fill material 127.

Any remaining second photo resist 223, the second ARC layer 222, and the second hard mask layer 221 are etched and removed. Any remaining dummy fill material 127 is also etched and removed thus forming the metal line trench and via trench or via opening.

Referring to FIG. 5G, a second conductive liner 121 is deposited into the metal line trenches and via openings, and over a top surface of the second inter level dielectric layer 130, by a suitable process such as PVD, sputtering, CVD. The second conductive liner 121 comprises a diffusion barrier metal such as titanium nitride, titanium, tantalum, tantalum nitride, tungsten nitride, tungsten carbo nitride (WCN), ruthenium or other suitable conductive nitrides or oxides.

This second conductive liner 121 serves as a starting layer for the subsequent electroplating, and also as a diffusion barrier to encapsulate the conductor metal. As the barrier layer covers the bottom and the sidewalls of the metal line trenches and via openings, the deposition is designed to be more or less conformal. Further the barrier of the second conductive liner 121 is formed from a material with high melting point, for instance tantalum or titanium and nitrides thereof. In contrast to copper, such materials are robust with respect to migration processes (electro and stress migration) even at elevated temperatures.

In one or more embodiments, the deposition of the second conductive liner 121 may be adjusted so as to form a thicker layer on the sidewalls of the third metal line 13, particularly on the deep bottom sidewalls, which increases the aspect ratio. A thicker layer may be needed to avoid copper leaks and to form a stable contact layer with the first conductive liner 111.

Figure 5H:
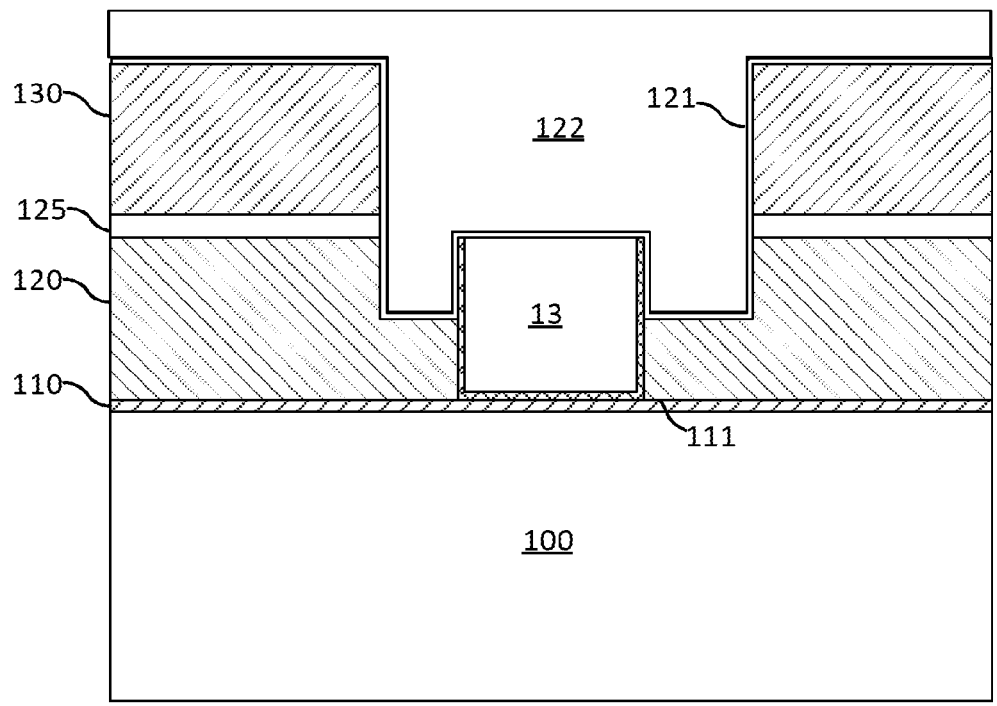

As next illustrated in FIG. 5H, a fill metal 122 is deposited over the second conductive liner 121. The fill metal 122 is deposited by an electro chemical deposition process in various embodiments. The fill metal 122 comprises copper or its alloys, although in some embodiments it may comprise aluminum, gold, tungsten, and combinations thereof or other suitable conductive materials. The fill metal 122 and second conductive liner 121 form the upper level metal line 30, as well as the via 20 connecting the upper level metal line 30 with the third metal line 13. The fill metal 122, which may be copper may be deposited into the metal line trenches and via openings as well as over the top surface of the second inter level dielectric layer 130.

In various embodiments, the fill metal 122 is introduced without forming voids due to change in aspect ratio next to the sidewalls of the third metal line 13.

As illustrated in FIG. 5H, the fill metal 122 is planarised and polished using a suitable process such as chemical mechanical polishing (CMP). Fill metal 122 deposited over the top surface of the second inter level dielectric layer 130 is removed by the CMP process, thus separating adjacent metal lines in the second inter level dielectric layer 130. After the CMP process, fill metal 122 is only left inside the metal line trenches and via openings so as to form metal lines and vias such as the upper level metal line 30 and the via 20.

The top surface of the metal line 30 is encapsulated by a dielectric diffusion barrier in order to prevent copper to migrate into the dielectric. Subsequent metal levels and vias levels may be formed over the fill metal 122 and the second inter level dielectric layer 130 by repeating the processes illustrated in FIGS. 5B-5H.

Figure 6:
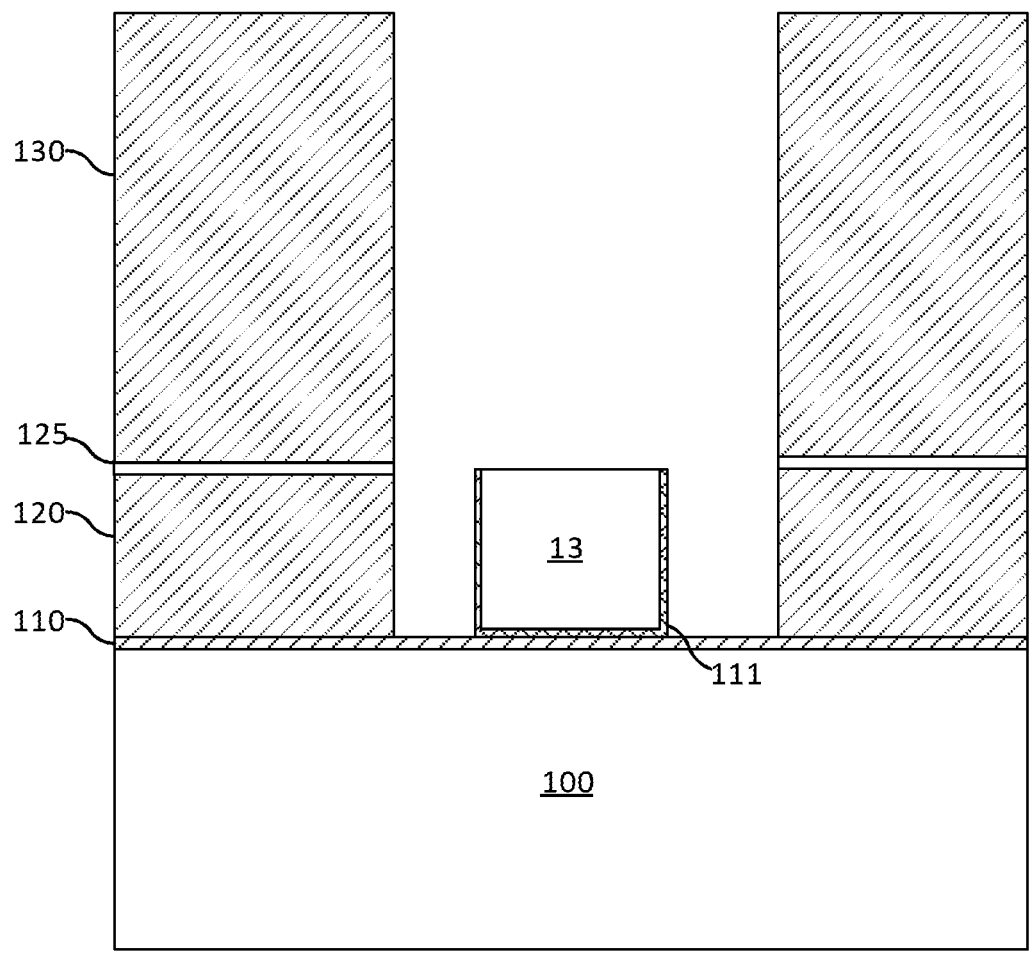
FIG. 6 illustrates an alternative embodiment of fabricating the semiconductor device.

FIG. 6 illustrates an alternative embodiment of fabricating the semiconductor device. FIG. 6 describes the process flow used in forming the wrap around via described in FIG. 2.

In various embodiments, etch stop layers may be used to define the depth of the via 20 more accurately. In particular, if the metallization scheme is such that it uses an etch stop layer for the formation of the lower metal line (e.g., third metal line 13). This etch stop layer (e.g., first etch stop layer 110) may be re-used to stop the via etch process along the sidewall of the lower metal line. In this manner, the full sidewall height of the lower metal line may be used to form a barrier contact, without introducing any additional risk of etching the first inter level dielectric layer 120 too deeply and unintentionally contacting any metal structures below.

Accordingly, unlike FIG. 5C, which used a timed etch to etch below the third metal line 13, in this embodiment, the anisotropic etching process is stopped on the first etch stop liner 110. Thus, in this embodiment, the via 20 completely wraps around at least two of the sidewalls of the third metal line 13 (as also illustrated in FIG. 2). As described previously, an isotropic dielectric etching process may be used to remove any remaining spacer of the first dielectric material 120 on the sidewalls of the third metal line 13. Subsequent processing may proceed as described further using FIGS. 5E-5H.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-6 may be combined with each other in alternative embodiments. It is therefore intended that the appended claims encompass any such modifications or embodiments.

What is claimed is:

1. A semiconductor device comprising:
    a first metal line disposed in a first insulating layer, the first metal line having a first section, a second section, and a third section connecting the first section with the second section, the first section and the second section being parallel and the third section being perpendicular to the first section and the second section; and
    a via having a portion surrounding a portion of a first sidewall of the second section of the first metal line and a portion of an opposite second sidewall of the second section of the first metal line;
    a second metal line disposed in the first insulating layer; and
    a third metal line disposed in the first insulating layer, wherein a distance from the second section of the first metal line to the second metal line is greater than a distance from the first section of the first metal line to the third metal line.

2. The device of claim 1, wherein the first metal line comprises a first conductive liner and a first fill metal, wherein the via comprises a second conductive liner and a second fill metal, wherein the first conductive liner contacts the second conductive liner on the portion of the sidewall of the first metal line.

3. The device of claim 1, wherein the portion of the via surrounds portions of exactly two sidewalls of the first metal line.

4. The device of claim 1, further comprising an upper metal line disposed in a second insulating layer, the second insulating layer disposed over the first insulating layer.

5. The device of claim 4, wherein the via is coupled between the first metal line and the upper metal line.

6. The device of claim 1, wherein the portion of the via comprises a conductive liner.

7. A semiconductor device comprising:
    a plurality of lower metal lines disposed in a first insulating layer;
    a plurality of upper metal lines disposed in a second insulating layer, the second insulating layer disposed over the first insulating layer; and
    a plurality of vias disposed between the plurality of lower metal lines and the plurality of upper metal lines, wherein each via of the plurality of vias surrounds a portion of a sidewall of a metal line of the plurality of lower metal lines, wherein the plurality of lower metal lines is oriented perpendicular to the plurality of upper metal lines, wherein each of the plurality of vias is a cross-point via between one of the plurality of lower metal lines and one of the plurality of upper metal lines so as to form a cross-point array grid.

8. The device of claim 7, wherein the distance between the metal lines in the plurality of lower metal lines is substantially equal.

9. The device of claim 7, wherein each of the plurality of lower metal lines comprises a first conductive liner and a first fill metal, wherein each of the plurality of vias comprises a second conductive liner and a second fill metal, wherein the first conductive liner of the plurality of lower metal lines contacts the second conductive liner of the plurality of vias.

10. The device of claim 7, wherein the via of the plurality of vias surrounds the portion of the sidewall of the first metal line and a portion of an opposite second sidewall of the first metal line.

11. A semiconductor device comprising:
    an etch stop layer disposed over a substrate;
    a first insulating layer disposed over the etch stop layer;
    a first metal line disposed over the etch stop layer and in the first insulating layer;
    a second insulating layer, the second insulating layer disposed over the first insulating layer;
    a second metal line disposed in the second insulating layer; and
    a via disposed between the first metal line and the second metal line, the via having a portion surrounding a portion of a first sidewall and a portion of an opposite second sidewall of the first metal line, wherein the via extends along the portion of the first sidewall and along the portion of the second sidewall to contact the etch stop layer.

12. A semiconductor device comprising:
- a lower metal comprising a conductive mesh-like pattern comprising horizontal conductive sections, vertical conductive sections, and nodes at the intersection of the horizontal conductive sections and the vertical conductive sections; and
- a plurality of vias coupled to the nodes of the lower metal, wherein each of the vias overlaps and surrounds with a portion of one of the horizontal conductive sections and one of the vertical conductive sections.

13. The device of claim 12, wherein each of the plurality of vias surrounds two sidewalls of two of the horizontal conductive sections intersecting at each of the nodes.

14. The device of claim 13, wherein each of the plurality of vias surrounds two sidewalls of two of the vertical conductive sections intersecting at each of the nodes.

* * * * *